(12) United States Patent
Chakrabartty

(10) Patent No.: US 8,060,810 B2
(45) Date of Patent: Nov. 15, 2011

(54) MARGIN DECODING COMMUNICATIONS SYSTEM

(75) Inventor: Shantanu Chakrabartty, Williamston, MI (US)

(73) Assignee: Board of Trustees of Michigan State University, East Lansing, MI (US)

(*) Notice: Subject to any disclaimer, the term of this patent is extended or adjusted under 35 U.S.C. 154(b) by 1257 days.

(21) Appl. No.: 11/784,519

(22) Filed: Apr. 6, 2007

(65) Prior Publication Data

US 2007/0250759 A1 Oct. 25, 2007

Related U.S. Application Data

(60) Provisional application No. 60/790,176, filed on Apr. 7, 2006.

(51) Int. Cl.
*H03M 13/03* (2006.01)
*H03M 13/00* (2006.01)
(52) U.S. Cl. ............ 714/786; 714/752; 341/94
(58) Field of Classification Search .......... 714/752, 714/786; 341/94
See application file for complete search history.

(56) References Cited

U.S. PATENT DOCUMENTS

| 7,253,761 | B1* | 8/2007 | Hoyos et al. | 341/155 |
|---|---|---|---|---|
| 7,609,774 | B2* | 10/2009 | Horng et al. | 375/260 |
| 7,805,642 | B1* | 9/2010 | Farjadrad | 714/708 |
| 2004/0082356 | A1* | 4/2004 | Walton et al. | 455/522 |
| 2007/0089016 | A1* | 4/2007 | Bhatt et al. | 714/752 |
| 2007/0089017 | A1* | 4/2007 | Tang et al. | 714/752 |
| 2007/0089018 | A1* | 4/2007 | Tang et al. | 714/752 |
| 2007/0089019 | A1* | 4/2007 | Tang et al. | 714/752 |

OTHER PUBLICATIONS

R.G. Gallager, "Low Density Parity Check Codes," IRE Trans. Inf. Theory, vol. IT-8, pp. 2128, (1962).
D.J.C. MacKay and M.C. Davey, "Evaluation of Gallager Codes for Short Block Length and High Rate Applications," in Codes, Systems and Graphical Models, B. Marcus and J. Rosenthal, Eds., (2000), vol. 123, IMA Volumes in Mathematics and Its Applications, pp. 113-130.
Digital Video Broadcasting (DVB-S2) Via Satellite "http://www.dvb.org".
B. Bangerter et al., "High-throughput Wireless LAN Air Interface," Intel Technol. J., vol. 7, No. 3, (Aug. 2003) "http://www.intel.com/technology/itj".
Y. Rashi et al., LDPC: Efficient Alternative FEC for the TFI-OFDM PHY Proposal. IEEE 802.15 Working Group for WPAN "http://grouper.ieee.org.groups/802/15/pub".
J. Fan; LDPC: Efficient Alternative FEC for the TFI-OFDM PHY Proposal. IEEE 802.20 Mobile Broadband Wireless Acess (MBWA) "http://grouper.ieee.org/groups/802/20/Contribs".
J. Pearl; "Probabilistic Reasoning in Intelligent Systems: Networks of Plausible Inference". San Mateo, CA; Morgan Kaufmann, pp. 143-233; (1988).
J. Hagenauer, E. Offer and L. Papke; "Iterative Decoding of Block and Convolutional Codes," IEEE Trans. Inf. Theory, vol. IT-42, No. 3; pp. 429-445, (Mar. 1996).

(Continued)

*Primary Examiner* — John J Tabone, Jr.
(74) *Attorney, Agent, or Firm* — Harness, Dickey & Pierce, P.L.C.

(57) ABSTRACT

A margin decoding communications system includes a circuit receiving a message encoded by an iterative code and processing the message into scores. A normalization process module receives the scores and iteratively approximates log-map normalization factors of the scores to generate approximation normalization factors. An element receives the message and the approximation normalization factors and decodes the received message based on the approximation normalization factors.

30 Claims, 10 Drawing Sheets

OTHER PUBLICATIONS

M. Moerz, T. Gabara, R. Yan and J. Hagenauer, "An analog 0.25 um BiCMOS tailbiting MAP decoder," in Proc. Int. Solid-State Circuits Conf. (ISSCC00), (Feb. 2000), pp. 356-357.

A.J. Blanksby and C.J. Howland, "A 690-mW 1-Gb/s 1024-b, rate-1/2 low-density parity-check code decoder", IEEE J. Solid-State Circuits, vol. 37, No. 3, pp. 404-412, (Mar. 2002).

M. M. Mansour and N. R. Shanbhag, "A 640 Mbps 2048-bit programmable LDPC decoder chip", IEEE J. Solid-State Circuits, vol. 41, No. 3, (Mar. 2006).

V. Gaudet and G. Gulak, "A 13.3-Mb/s 0.35 um CMOS analog turbo decoder IC with a configurable interleaver," IEEE J. Solid-State Circuits, vol. 38, No. 11, pp. 2010-2015, (Nov. 2003).

C. Winstead, J. Dai, S. Yu, C. Myers, R. Harrison, C. Schlegel, "CMOS analog MAP decoder for (8,4) Hamming Code," IEEE J. Solid-State Circuits, vol. 39, No. 1, pp. 122-131, (Jan. 2004).

D. Vogrig, A. Gerosa, A. Neviani, A.Gi Amat, G. Montorsi, S. Benedetto, "A 0.35-/spl mu/m CMOS analog turbo decoder for the 40-bit rate 1/3 UMTS channel code," IEEE Journal of Solid-State Circuits, vol. 40, pp, 753-762, (Mar. 2005).

S. Hermati, A.H. Banihashemi, C. Plett, "An 80-Mb/s 0.18-/spl mu/m CMOS analog min-sum iterative decoder for a (32, 8, 10) LDPC code," Proc. of IEEE Custom Integrated Circuits Conf., pp. 243-246, (Sep. 2005).

A.H. Banihashemi, S. Hemati, "Decoding in Optics", Proc. of International Symposium on Information Theory, (2002), p. 231.

H.A. Loeliger, F. Lustenberger, M. Helfenstein, F. Tarky, "Probability Propagation and Decoding in Analog VLSI", IEEE Trans. Inf. Theory, vol. 47, No. 2, pp. 837-843, (Feb. 2001).

F. Kschischang, B.J. Frey, H.A. Loeliger, "Factor Graphs and the Sum-product Algorithm", IEEE Trans. Inf. Theory, vol. 47, No. 2, pp. 498-519, (Feb. 2001).

S. Chakrabartty and G. Cauwenberghs, "Margin Propagation and Forward Decoding in Analog VLSI", Proc. IEEE Int. Symp. circuits and Systems (ISCAS2004), Vancouver Canada, (May 23-26, 2004).

S. Chakrabartty, "CMOS analog iterative decoders using margin propagation circuits", Proc. of Int. Symp. on Circuits and Systems, Kos, Greece (2006).

C. Kong and S. Chakrabartty, "Analog iterative LDPC decoders based on margin propagation," Proc. Analog Decoding Workshop, Torino, Italy, (Jun. 5-6, 2006).

T. Richardson, M. Shokrollahi, R. Urbanke, "Design of Capacity Approaching Irregular Low-Density Parity-check codes", IEEE Trans. Inf. Theory, vol. 47, No. 2, pp. 619-637, (Feb. 2001).

L. Ping, W. K. Leung, "Decoding Low Density Parity Check Codes with Finite Quantization bits", IEEE Comm. Lell, vol. 4, pp. 62-64, No. 2, (Feb. 2000).

S. Chakrabartty, G. Cauwenberghs, "Power Dissipation Limits and Large Margin in Wireless Sensors", Proc. IEEE Int. Symp. Circuits and Systems (ISCAS 2003), Bangkok Thailand, (May 25-28, 2003).

S. Chakrabartty, G. Cauwenberghs, "Forward-Decoding Kernel-Based Phone Sequence Recognition", Adv. Neural Information Processing Systems (NIPS 2002), Cambridge: MIT Press, vol. 15, (2003).

T. Cover and J. Thomas, "Elements of Information Theory", pp. 349-367, (1991).

J. P. Chamorro, C. Lahuec, F. Seguin, M. Jezequel, "Design rules for subthreshold MOS circuits", presented at the Analog Decoding Workshop (ADW 06), Turin, Italy, (Jun. 2006).

C. Winstead, N. Nguyen, V. Gaudet, C. Schlegel, Low-voltage CMOS circuits for analog iterative decoders, IEEE Trans. Circuits Syst. I, Reg. Papers, vol. 53, No. 4, pp. 829-841, (Apr. 2006).

S. Hemati, A. H. Banihashemi,C. Plett, "An 80-Mb/s 0.18-um CMOS analog min-sum iterative decoder for a (32, 8, 10) LDPC code", IEEE J. Solid-State Circuits, vol. 41, No. 11, pp. 2531-2540, (Nov. 2006).

* cited by examiner

MARGIN DECODING COMMUNICATIONS SYSTEM

CROSS-REFERENCE TO RELATED APPLICATIONS

This application claims the benefit of U.S. Provisional Application No. 60/790,176, filed on Apr. 7, 2006. The disclosure of the above application is incorporated herein by reference.

FIELD

The present disclosure generally relates to error correction coding. More specifically, the present invention relates to an analog system and method for iterative decoding of turbo, low-density parity check (LDPC) or turbo-like encoded data.

BACKGROUND

The statements in this section merely provide background information related to the present disclosure and may not constitute prior art.

Underlying the success of low-density parity-check (LDPC) codes and its acceptance into emerging digital video broadcasting (DVB-S2) and wireless standards (802.11, 802.12, 802.20) has been its fast and hardware realizable decoding process. Conventional LDPC decoders are either based on sum-product processes or use suboptimal min-sum (MS) processes. Both decoding processes are soft-decision processes that operate in either probability or log-likelihood ratio (LLR) domains and are amenable to parallel analog and digital hardware implementations. In particular, analog decoders are attractive over their digital counterparts because of their potential to achieve superior energy efficiency at fixed decoding speeds. Popular topology for analog LDPC decoders has been based on trans-linear circuits using either bipolar transistors or MOS transistors biased in weak inversion. Alternate analog topology based on min-sum approximation of sum-product process has been reported and has been mapped onto optical networks for high-speed decoding.

The LDPC decoding process can be expressed by equations in terms of a log-MAP formulation. LDPC codes are a class of binary linear block codes whose parity check matrix contains only a few 1's in comparison to the amount of 0s. An example of a parity check matrix H and its tanner or factor graph are shown in FIG. 1. A factor graph consists of variable nodes $v_k, k=1, \ldots, N_c$ which are connected to check nodes $c_i, i=1 \ldots, M$ using edges. The number of edges associated with each node (also known as degree of the node) is represented by $d_c$ for check nodes and as $d_v$ for variable nodes. The parity check matrix for LDPC code is represented by $H(d_v, d_c)$.

For detailed treatment and analysis of LDPC decoding based on sum-product process, reference may be had to J. Hagenauer, E. Offer, and L. Papke, "Iterative decoding of block and convolutional codes," IEEE Trans. Inf. Theory, vol. IT-42, no. 3, pp. 429445, March 1996, which is incorporated herein by reference in its entirety for any purpose. More briefly, let $V_i$ denote a set of check nodes connected to the variable node $v_i$ and $V_{i-j}$ represent the set of check nodes other than $c_j$ that are connected to variable node vi. Similarly let $C_j$ denote a set of variable nodes connected to the check node $c_j$ and $C_{j-i}$ represent the set of variable nodes other than the node $v_i$ connected to $c_j$.

In a message passing process, each check node $c_j$ receives messages from its set of neighbors $C_j$ (denoted by $L(v_i \rightarrow c_j)$) and computes messages to be sent to the variable nodes $v_i \in C_j$ (denoted by $L(c_j \rightarrow v_i)$) according to $$L(c_j \rightarrow v_i) = 2\tanh^{-1}\left[\prod_{v_k \in C_{j-1}} \tanh\left(\frac{L(v_k \rightarrow c_j)}{2}\right)\right] \quad (1)$$

where $\tan h(\chi)=(\exp(\chi)-\exp(-\chi))/(\exp(\chi)+\exp(-\chi))$. In subsequent iterations, the variable nodes $v_i$ receive messages from its check nodes $c_j \in V_i$ and re-computes messages (denoted by $L(v_i \rightarrow c_j)$) that will be sent to the check node $c_j$ according to $$L(c_j \rightarrow v_i) = L(v_i) + \sum_{c_k \in V_{j-1}} L(c_k \rightarrow v_i). \quad (2)$$

Messages are propagated back and forth between the variable and check nodes for a pre-determined number of iterations before a decision on the received bits is performed.

In LDPC decoding, the computationally intensive core is equation (1) which requires evaluations of hyperbolic function. Several approximations have been proposed in literature that approximate floating point computation of hyperbolic functions, some of which include the use of finite resolution look tables for digital implementations or a min-sum approximation for analog implementations. Equation (1) can be computed recursively according to the following process:
1) Initialize $L(v_i \rightarrow c_j) = -\infty$.
2) Repeat the following recursion for each element $v_j \in C_{j-i}$ $$L(v_i \rightarrow c_j) \leftarrow \log\left[\frac{1 + e^{L(v_i \rightarrow c_j)+L(c_j \rightarrow v_i)}}{e^{L(v_i \rightarrow c_j)} + e^{L(c_j \rightarrow v_i)}}\right]. \quad (3)$$

The update equation (3) is the fundamental operation for implementing LLR based LDPC decoders. For the sake of brevity, the operation (3) can be compactly represented as $x \leftarrow \log(1+e^{x+y})-\log(e^x+e^y)$ where the arbitrary variables x, y represent the likelihoods. Before we introduce the log-MAP formulation and subsequently margin propagation, we will first decompose variables x and y into differential representations as $x=x^+-x^-$ and $y=y^+-y^-$ with $x^+, x^-, y^+, y^- \geq 0$. Such a decomposition is desirable for analog circuit implementation because a fully differential architecture is robust to common-mode interference. Equation (3) can be represented as the following differential updates:

$$x^+ \leftarrow \log[e^{x^+ + y^+} + e^{x^- + y^-}] \quad (4)$$

$$x^- \leftarrow \log[e^{x^+ + y^-} + e^{x^- + y^+}] \quad (5)$$

Each of the updates (4), (5) are in the form of a "log-MAP" normalization which are popular in Bayesian network literature.

SUMMARY

In accordance with the present invention, a margin decoding communications system includes a circuit receiving a message encoded by an iterative code and processing the message into scores. A normalization module receives the scores and iteratively approximates log-map normalization factors of the scores to generate approximation normalization factors. An element receives the message and the approximation normalization factors and decodes the received message based on the approximation normalization factors.

The margin propagation process is advantageous over previous decoding processes for implementing analog decoders. For example, unlike conventional analog decoders which rely on trans-linear operation of transistors, margin propagation (MP) based decoders use only additions, subtractions and threshold operations and can be mapped onto several analog networks (current-mode, charge-mode, or non-electronic circuits). Additionally, compared to trans-linear and min-sum approaches, the computational core of margin propagation can be implemented using universal conservation laws (charge, current, energy, mass etc.) and therefore can be mapped onto several analog architectures. Also, the properties and performance of margin propagation analog LDPC decoders are superior compared with those of alternative decoders based on sum-product and min-sum (MS) process. In particular, margin based LDPC decoders achieve near identical bit error rate performance as their floating point sumproduct counterparts and superior performance as compared to MS decoders. Moreover, when messages in LDPC decoding process are corrupted by additive noise, margin decoders demonstrate superior performance, compared to sum-product and MS based decoders.

Further areas of applicability will become apparent from the description provided herein. It should be understood that the description and specific examples are intended for purposes of illustration only and are not intended to limit the scope of the present disclosure.

DRAWINGS

The present invention will become more fully understood from the detailed description and the accompanying drawings, wherein.

Figure 5:
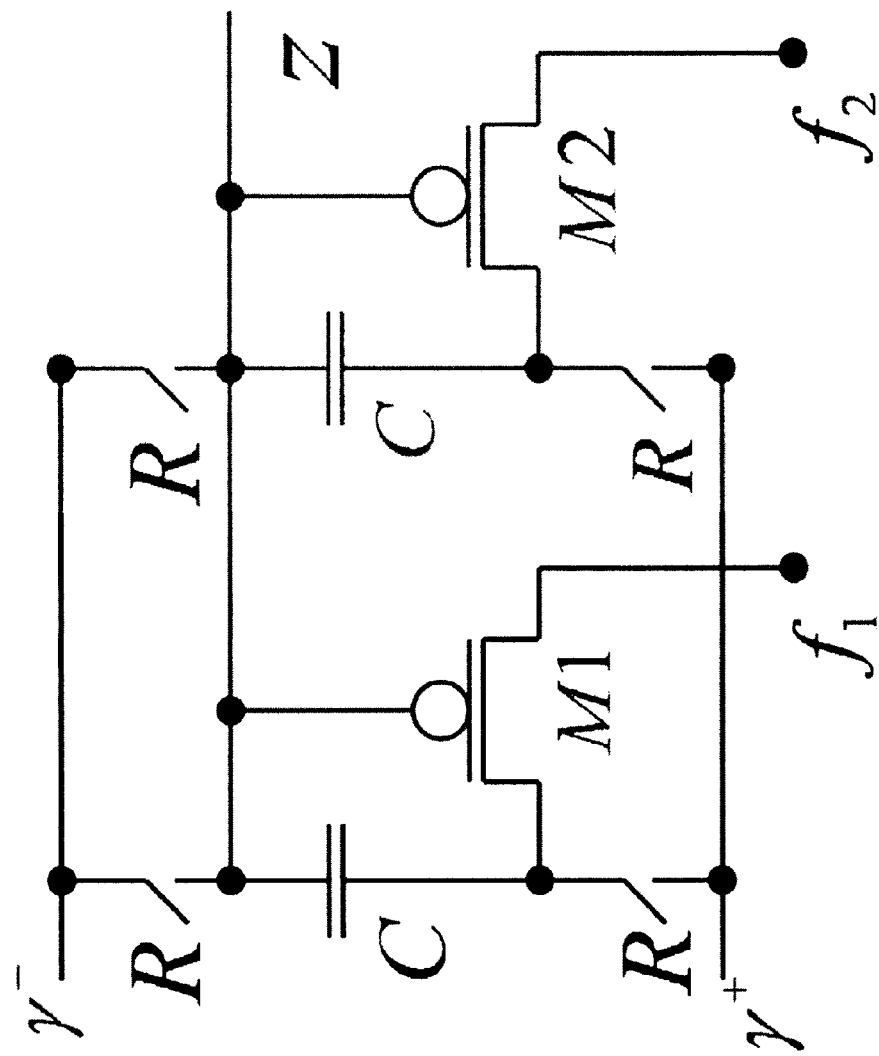
Figure 6:
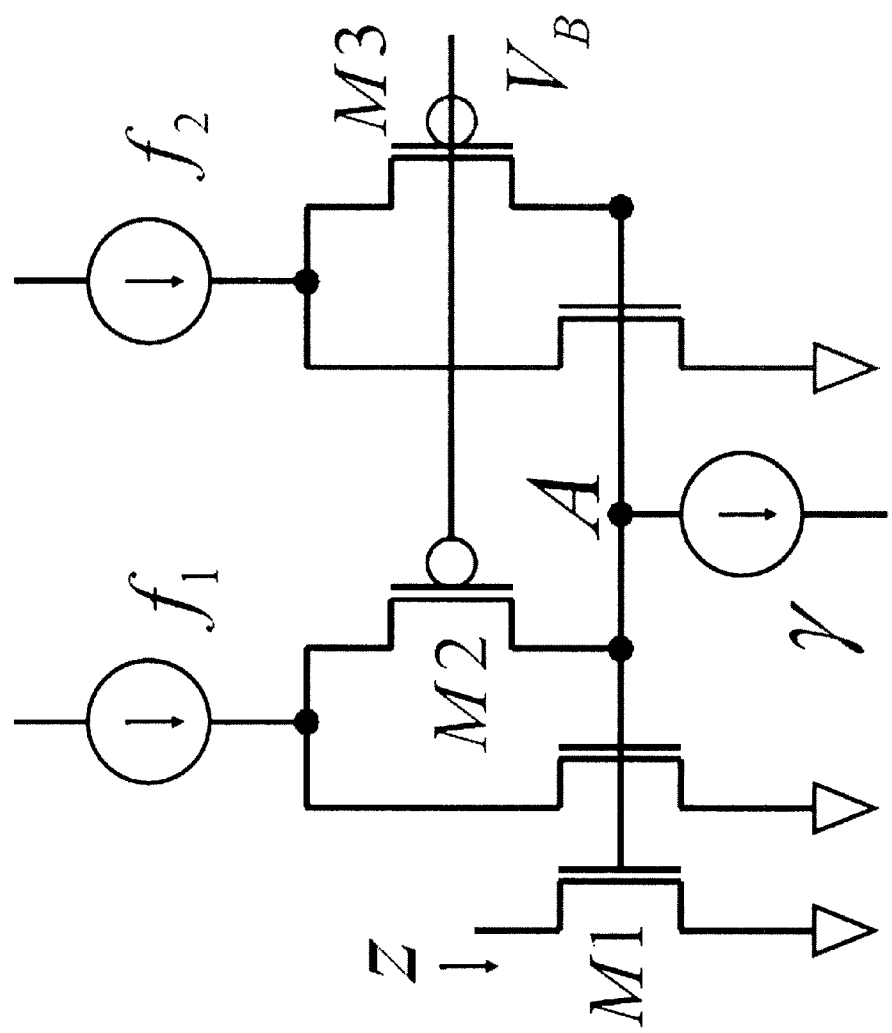
Figure 7:
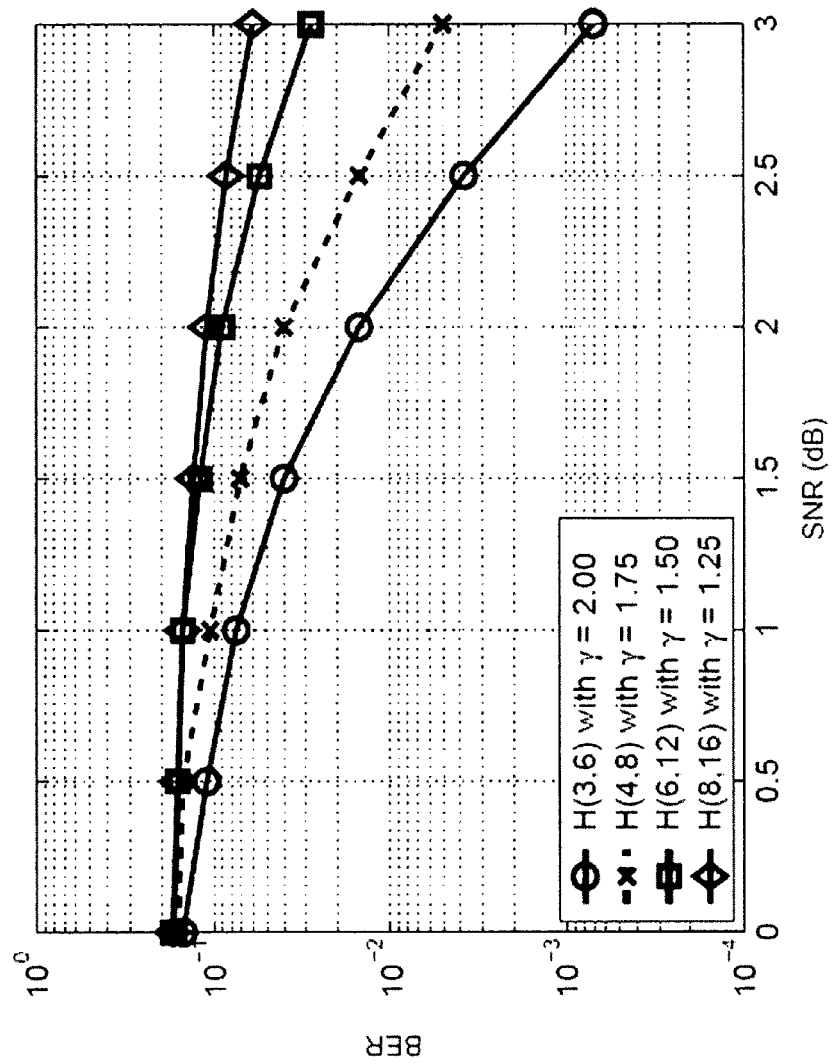
Figure 8:
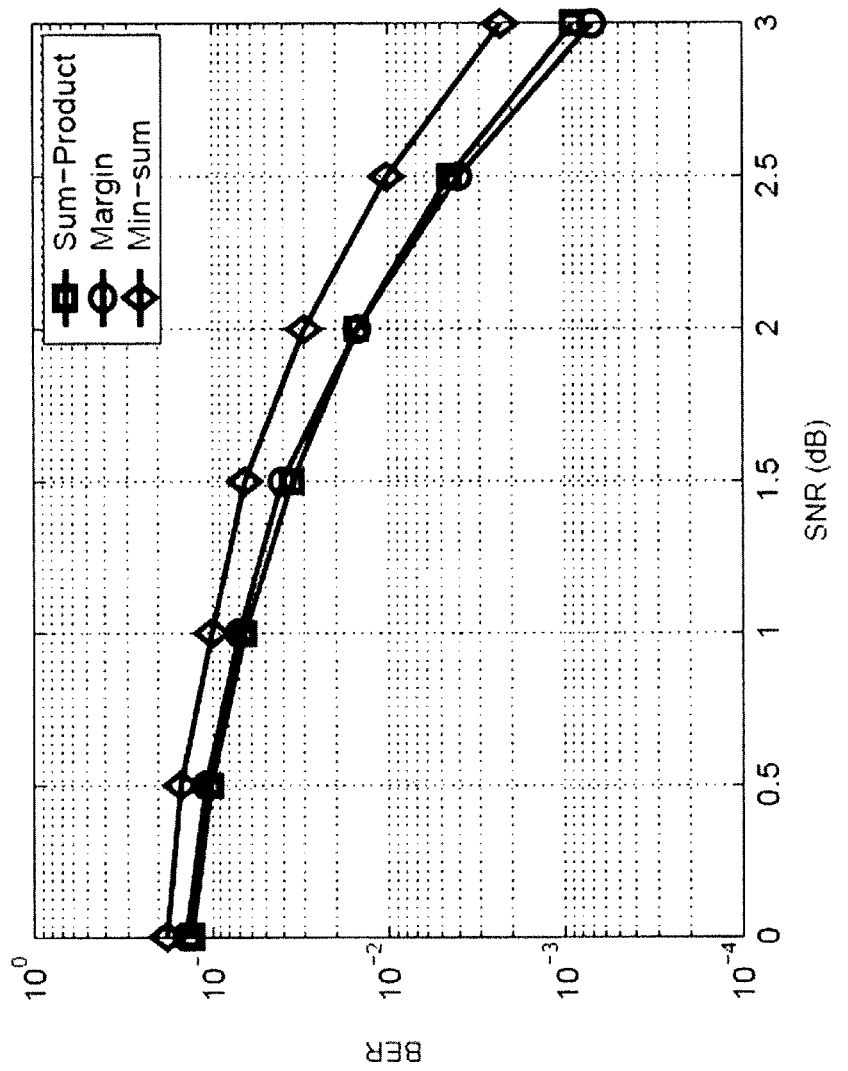
Figure 9:
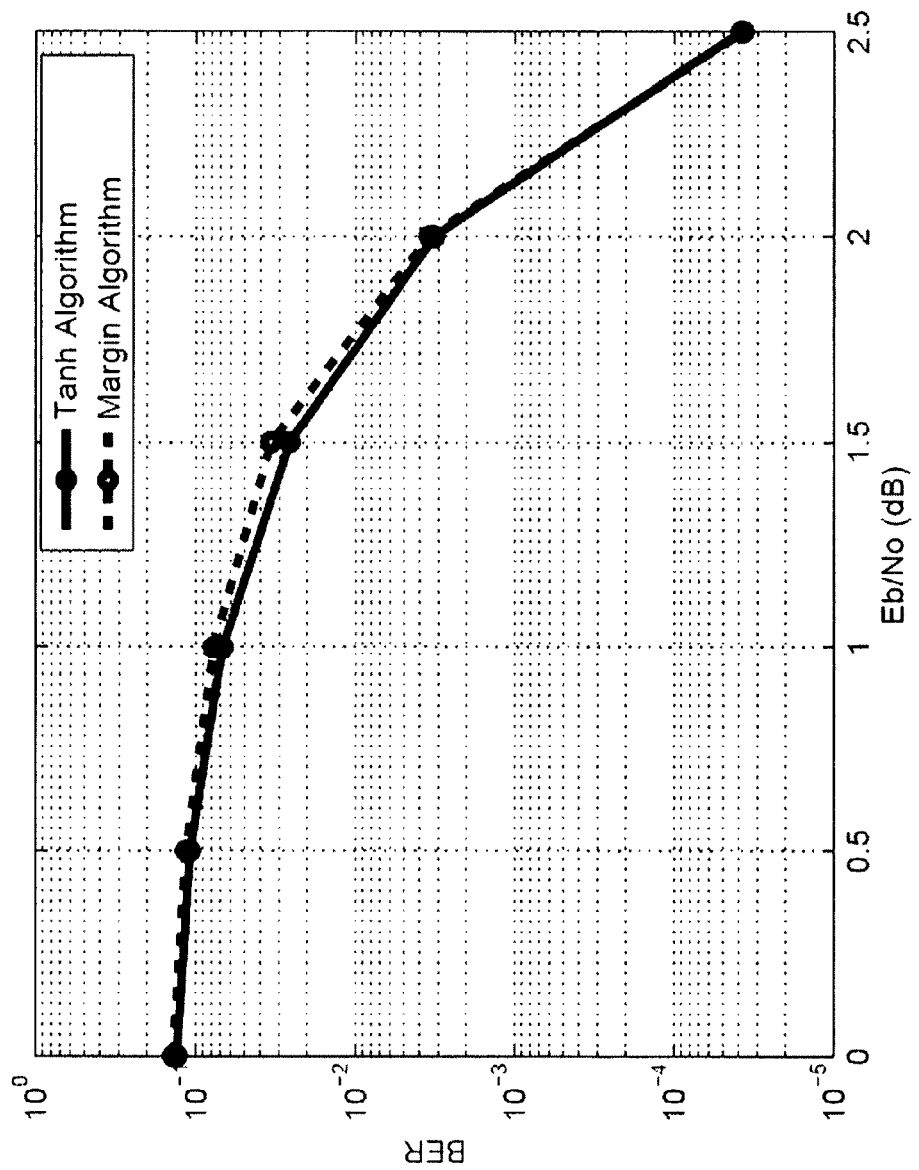
Figure 10:
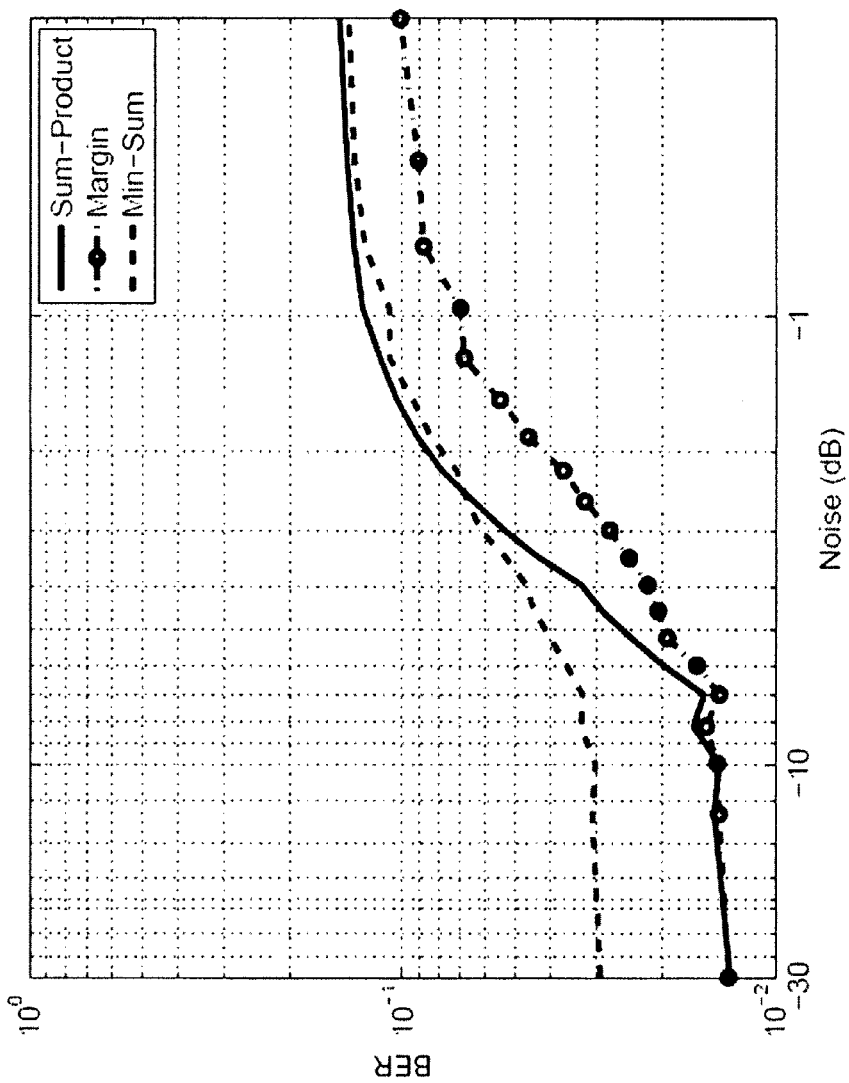

FIG. 4(a)-4(c) are diagrams illustrating a CCD based implementation of margin normalization in accordance with the presently preferred embodiment of the present invention;

FIG. 5 is an electrical circuit diagram illustrating a charge mode implementation of the reverse water-filling process in accordance with the presently preferred embodiment of the present invention;

FIG. 6 is an electrical diagram illustrating a current mode implementation of the reverse water-filling process in accordance with another embodiment of the present invention;

FIG. 7 is a graphical representation illustrating optimal value of margin parameter γ for LDPC codes of different node degree and size in accordance with the presently preferred embodiment of the present invention;

FIG. 8 is a graphical representation illustrating comparison of BER curves for iterative decoders implemented using sum-product, min-sum, and the margin propagation process in accordance with the presently preferred embodiment of the present invention;

FIG. 9 is a graphical representation illustrating comparison of the BER curves obtained for an LDPC code with length $N_c=2048$ using log-MAP and margin based decoder in accordance with the presently preferred embodiment of the present invention; and FIG. 10 is a graphical representation illustrating the case when messages in LDPC decoding process are corrupted by additive noise, margin decoders in accordance with the present invention demonstrate superior performance in BER, compared to sum-product and MS based decoders.

DETAILED DESCRIPTION

The following description is merely exemplary in nature and is not intended to limit the present disclosure, application, or uses.

Figure 1:
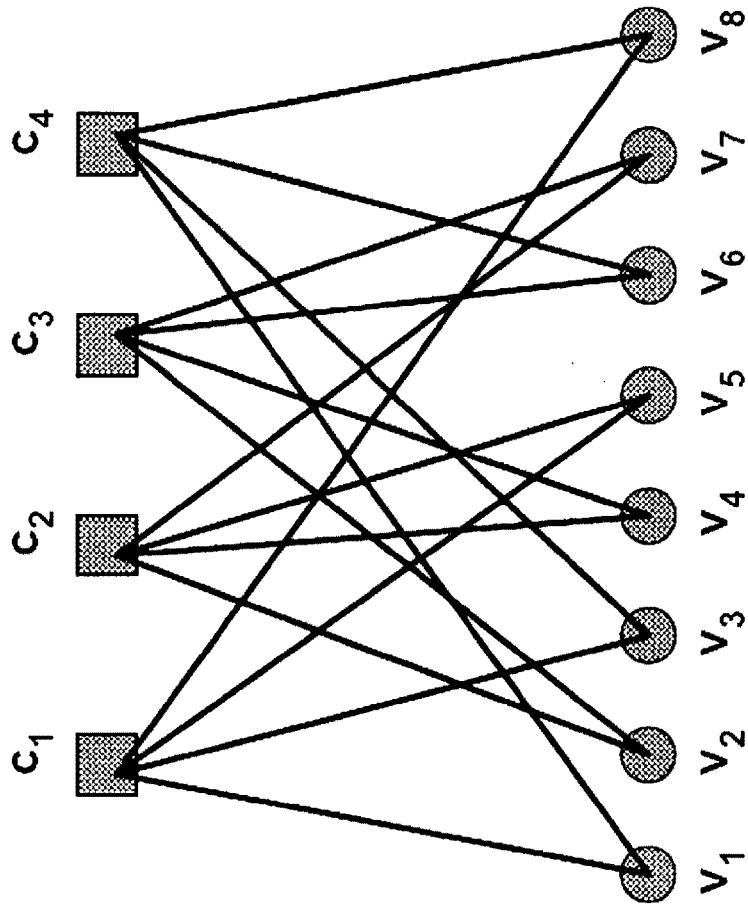
FIG. 1(a) is a diagram illustrating a H(2,4) parity check matrix in accordance with the prior art.
FIG. 1(b) is a diagram illustrating a factor graph corresponding to the matrix of FIG. 1(a) in accordance with the prior art.
Figure 2:
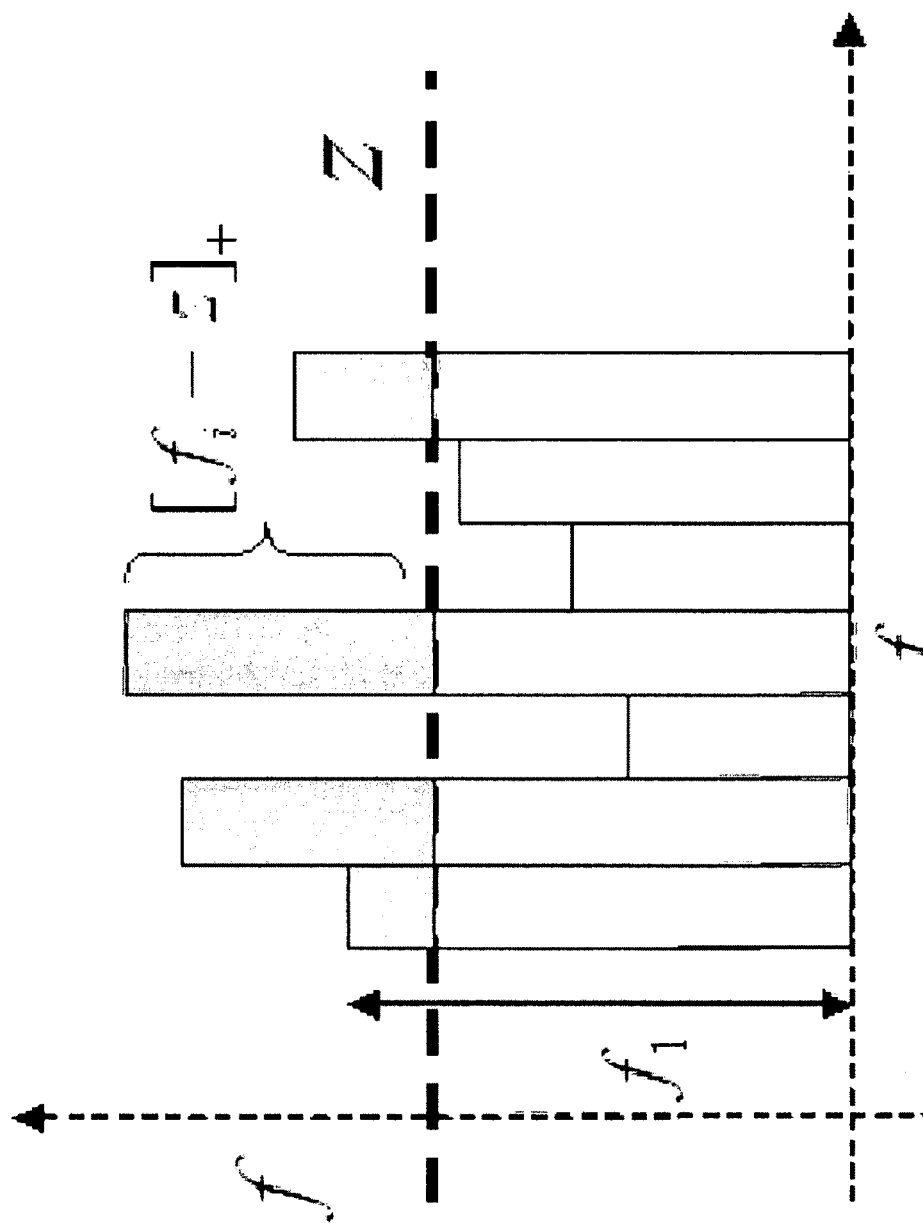
FIG. 2 is a diagram illustrating the margin normalization procedure in accordance with a presently preferred embodiment of the present invention.

A margin propagation based iterative analog decoding process accomplishes decoding for low density parity check (LDPC) codes. At the core of margin propagation is reverse water-filling process that performs a normalization operation. Given a set of scores $f_i \in R, i=1, \ldots, N$, reverse water-filling computes a normalization factor $z \in R$ according to the equation $$\sum_i^N [f_i - z]_+ = \gamma \qquad (6)$$

where $[.]_+ = \max(.,0)$ denotes a threshold operation and $\gamma \geq 0$ represents a parameter of the process. The solution to constraint (6) is shown in FIG. 2, where the cumulative score beyond the normalization factor z (shown by the shaded area) equals γ. A process to obtain z based on equation (6) requires nested routines involving sorting and binary search which makes its digital implementation complex and cumbersome. However, this can be naturally implemented on analog structures using universal conservation laws (charge, current, mass etc).

The margin normalization factor computed according to equation (6) can be used to approximate factors computed according to a log-MAP normalization. For a set of scores $f_i, i=1, \ldots, N$, log-MAP normalization factor is computed according to $$z = \log \sum_i^N e^{f_i} \qquad (7)$$

Figure 3:
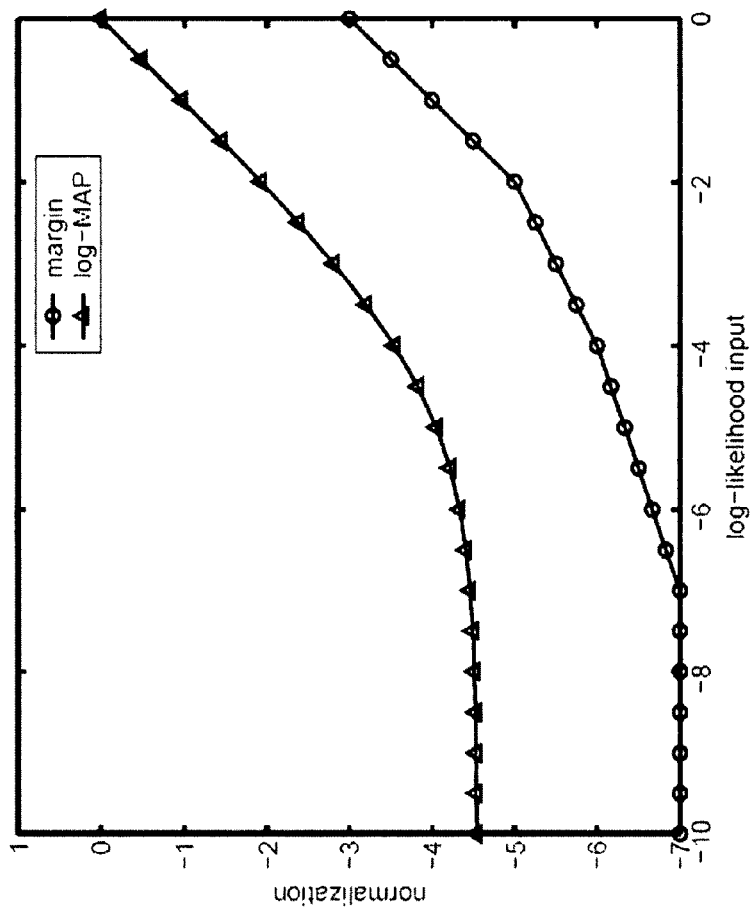
FIG. 3 is a graphical representation illustrating comparison of normalization scores computed according to log-MAP normalization and margin normalization in accordance with the presently preferred embodiment of the present invention.

FIG. 3 compares margin normalization factor computed according to equation (6) with log-MAP normalization factor computed according to (7), when only one of the likelihood scores is varied. FIG. 3 shows that margin normalization is a piece-wise linear approximation of log-MAP normalization, differing only by a constant.

Margin normalization can be applied to recursions (4) and (5) by approximating the differential log-MAP normalization factors as $$L(v_i \to c_j) \leftarrow (z_1 - z_2) \qquad (8)$$

where the normalization factors $z_1$ and $z_2$ are computed according to the following reverse water-filling constraints $$[x^+ + y^+ - z_1]_+ + [x^- + y^- - z_1]_+ = \gamma \qquad (9)$$

and $$[x^- + y^+ - z_2]_+ + [x^+ + y^- - z_2]_+ = \gamma \qquad (10)$$

$x^+, x^-, y^+$ and $y^-$ are differential representations of likelihoods as $x^+ = L^+(v_i \to c_j), x^- = L^-(v_i \to c_j), y^+ = L^+(c_j \to v_i)$, and $y^- =$ $L^-(c_j \rightarrow v_i)$. The normalization parameter $\gamma$ is dependent only on size and degree of the nodes in the parity check matrix.

Margin propagation and its underlying reverse water-filling process can be naturally mapped onto several analog computational structures. FIG. 4(a)-(c) illustrates a possible implementation for solving equation (6) on a charged coupled device (CCD). The figure shows a CCD consisting of several potential wells whose depths can be adjusted by application of an external voltage to CCD electrodes. As shown in FIG. 4(a), the initial charge in the potential wells is $\gamma$ and the initial depths of all the wells are equal. The depths of the wells are then monotonically adjusted adiabatically in parallel such that the charge re-distributes itself to an equilibrium condition. This is shown in FIG. 4(b). The procedure terminates when all the potential well depths have been adjusted to levels proportional to scores $f_i, i=1, \ldots, N$. This is shown in FIG. 4(c). At the end of the procedure, the equilibrium condition based on charge conservation amongst potential wells satisfies the reverse water-filling criterion given by (6). The normalization parameter z represents the bulk potential of the CCD and the residual charge in the $i^{th}$ potential well is proportional to the value $[f_i-z]+$.

Even though the above description uses charge as the parameters for analog computation, other physical parameters can also be used. For instance, the potential wells in illustration 4 can be replaced by micro-fluidic chambers in a MEMS device, where the computation can be performed using a noncompressive fluidic medium. Reverse water-filling functionality can also be emulated on CMOS devices using charge mode or current mode circuits. A current mode implementation for margin propagation is illustrated in S. Chakrabartty, "CMOS analog iterative decoders using margin propagation circuits," Proceedings of International Symposium on Circuits and Systems, Kos, Greece, 2006, which in incorporated by reference herein in its entirety for any purpose.

Figure 4:
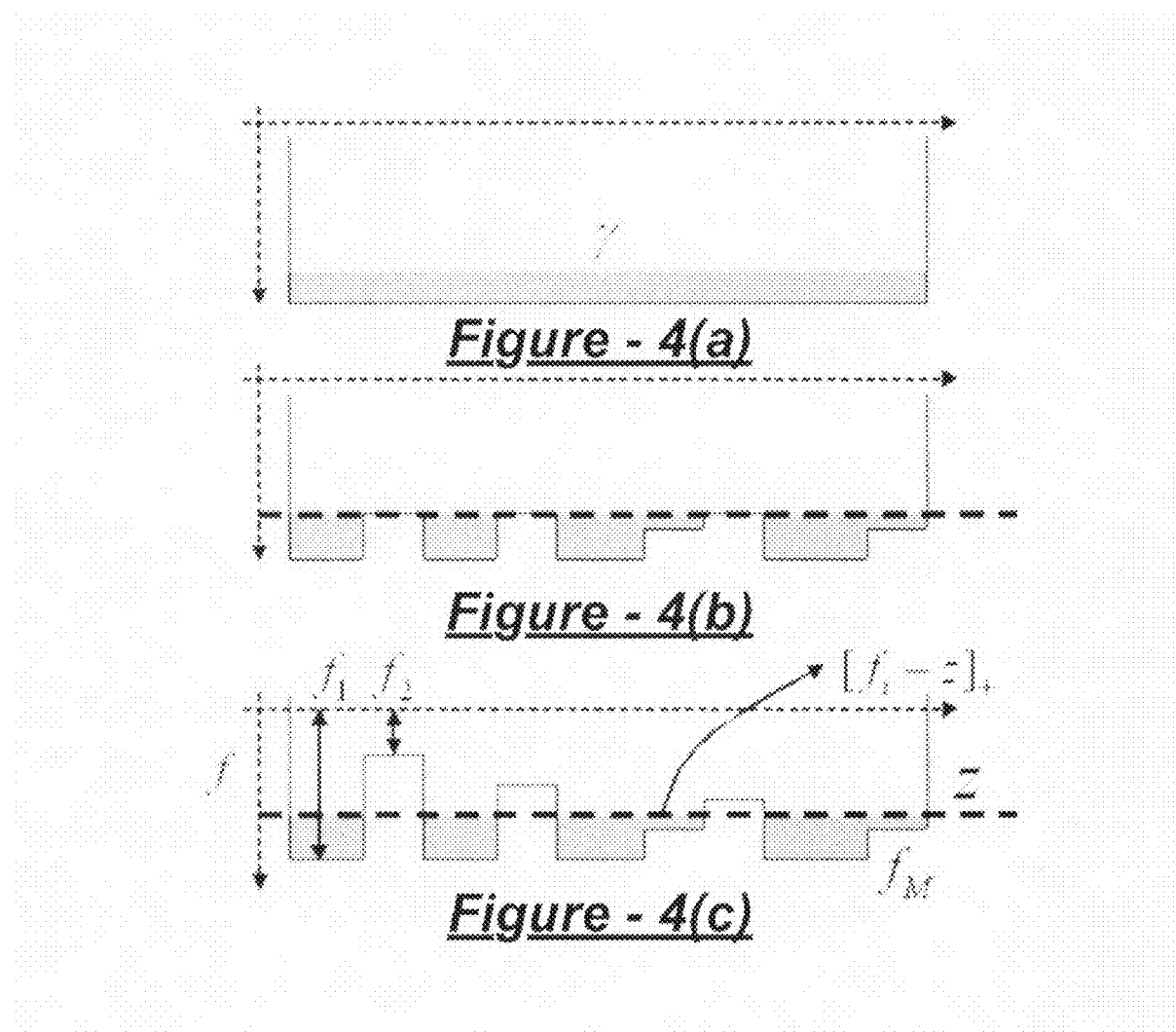

A CMOS charge mode implementation based on emulation of steps shown in FIG. 4 is shown by the circuit in FIG. 5. The circuit includes reset switches that regulate the flow of charge. During the reset phase (R=1), the charge stored on the node z is proportional to the differential parameter $\gamma^+ - \gamma^-$. When the reset switch is off (R=0), charge is distributed along the node z, subject to the constraints imposed by the pMOS transistors. Thus each capacitor will store charge proportional to the value $[f_i-z]+$. At equilibrium, the voltage at node z will settle down to satisfy the reverse water-filling criterion. Once the differential normalization factor z has been calculated, additions in update equations (9) and (10) can be obtained using switched-capacitor techniques.

A CMOS current mode implementation is shown in FIG. 6. The electrical circuit includes transistors M1, M2, and M3 and current mirrors. Both nMOS transistors, and pMOS transistors can be present. Current sources represent $\gamma$ and $f_i, i=1, \ldots, N$. Current conservation at node A satisfies the reverse water-filling constraint. The current through transistors M2 and M3 are equal to $[f_i-z]+$. The current that flows through transistor M1 is equal to z.

The performance of margin based LDPC decoding algorithm was compared to sum-product and min-sum based LDPC decoding algorithm using computer simulations. In the experiments, a rate 1/2 H(4, 8) LDPC code with a codeword length of $N_c=256$ and $N_c=1024$ was chosen. An additive white Gaussian noise (AWGN) channel with noise variance $N_0/2$ was used for simulations. An all reference zero codeword was transmitted using binary phase shift keying (BPSK) modulation. Subsequent to LDPC decoding bit error rate (BER) was plotted against signal-to-noise ratio (SNR), computed according to SNR=$10 \log_{10}(E_b/N_0)$ with $E_b$ representing energy per bit. The simulation results for codeword length of 256 were obtained after 10 message passing iterations where as 20 iterations of computations were used for codeword of length 1024.

The first set of experiments were used to determine the optimal value of $\gamma$ for parity check matrix with different node degree that produced the lowest BER. A code length of $N_c=256$ was chosen for the experiments. FIG. 7 shows BER curves obtained for optimal value of $\gamma$ for different rate 1/2 parity check matrices with varying node degrees. The plot shows performance degradation with the increase in degree. The figure also shows a monotonic behavior between degree of parity check matrix and the optimal value of $\gamma$. This behavior is attributed to an increase in density of 1's in a LDPC parity matrix (or number of interconnections in the LDPC factor graph), which leads to decrease in the relative margin (distance between scores) and hence decrease in optimal value of $\gamma$.

The next set of experiments compared the performance of margin based decoders with alternate decoding algorithms. FIG. 8 compares the BER obtained for the LDPC code with length $N_c=256$ using an sum-product (tan h), min-sum (MS) and margin based decoder. The result shows that the performance of margin based decoder is near identical to log-MAP decoder, where as MS decoder incurs a penalty of 0.3 dB as compared to log-MAP decoder. The performance penalty for MS decoder has already been observed and previously reported. FIG. 9 compares the BER curves obtained for an LDPC code with length $N_c=2048$ using log-MAP and margin based decoder, which reiterates the previous observation that margin based approximation of log-MAP decoding does not incur any performance penalty in its BER.

The advantage of margin based decoding over log-MAP decoding can be demonstrated for the scenario where the communication channel used for propagating the messages between variable and check nodes is non-ideal. Such a scenario arises in an analog iterative decoding hardware where the messages could be corrupted by substrate coupling noise or digital switching noise. For this experiment, two sources of additive noise were considered. A primary noise corrupts the BPSK signal at the receiver and a secondary noise corrupts the messages propagated on communication channel between nodes of the code graph. For the experiment, a rate 1/2 LDPC code of length $N_c=256$ was chosen. The SNR due to primary noise contribution was fixed to 2 dB and the SNR due to secondary noise contribution was varied. FIG. 10 compares the BER obtained for LDPC decoders implemented with log-MAP, MS and margin propagation. The results indicate a clear advantage of margin based decoder over both log-MAP and MS decoders as it demonstrates reduced degradation in BER for increasing secondary noise levels. It can also be seen from the figure that MS decoder is more robust to log-MAP decoder when the secondary noise level increased beyond a threshold. This is consistent with results that have been reported showing that MS decoders are more robust to message quantization than log-MAP based decoders.

More discussion of the teachings presented above can be found in: (a) S. Chakrabartty, "CMOS analog iterative decoders using margin propagation circuits," Proceedings of International Symposium on Circuits and Systems, Kos, Greece, 2006; and (2) C. Kong and S. Chakrabartty, "Analog iterative LDPC decoders based on margin propagation," Proc. Analog Decoding Workshop, Torino, Italy, Jun. 5-6, 2006. The contents of these disclosures are incorporated by reference herein in their entirety for any purpose.

One skilled in the art will recognize that the preferred embodiment of the present invention detailed above may be modified without departing from the spirit and scope of the present invention. Moreover, the description of the invention is merely exemplary in nature and, thus, variations that do not depart from the gist of the invention are intended to be within the scope of the invention.

What is claimed is:

1. A margin decoding communications system, comprising:
   a circuit receiving a message encoded by an iterative code and processing the message into scores;
   a normalization module receiving the scores and iteratively approximating log-map normalization factors of the scores to generate approximation normalization factors; and
   an element receiving the message and the approximation normalization factors and decoding the received message based on the approximation normalization factors.

2. The system of claim 1, wherein said normalization module is implemented on analog structures using at least one universal conservation law.

3. The system of claim 2, wherein the at least one universal conservation law is at least one of charge, current, or mass.

4. The system of claim 3, wherein the at least one universal conservation law is charge.

5. The system of claim 4, wherein the analog structures include a CMOS electrical circuit, comprising:
   capacitors;
   transistors; and
   reset switches that regulate flow of charge,
   wherein, during a reset phase (R=1), charge stored on a node z is proportional to a differential parameter $\gamma^+ - \gamma^-$, and, when at least one of said reset switches is off (R=0), charge is distributed along the node z, subject to constraints imposed by said transistors, thereby ensuring that each of said capacitors stores charge proportional to a value $[f_i - z]+$, and at equilibrium, a voltage at node z settles down to satisfy a reverse water-filling criterion, according to:

$$\sum_i^N [f_i - z] += \gamma.$$

6. The system of claim 3, wherein the at least one universal conservation law is current.

7. The system of claim 6, wherein the analog structures include a CMOS electrical circuit, comprising:
   sources of current herein represented as $f_i, i=1, \ldots, N$, and $\gamma$;
   a node through which a total of the current flowing into the node is equal to $\gamma$, thereby satisfying a reverse water-filling constraint according to:

$$\sum_i^N [f_i - z] += \gamma;$$

a transistor connected between said sources of current and said node, wherein a portion of the current that flows through the transistor is equal to z; and
   a plurality of at least two additional transistors operably connected between said sources of current and said node, wherein a portion of the current through said additional transistors is equal to $[f_i - z]+$.

8. The system of claim 3, wherein the at least one universal conservation law is mass.

9. The system of claim 1, wherein the iterative code comprises a low-density parity check code.

10. The system of claim 9, wherein said normalization module approximates differential log-MAP normalization factors $z_1$ and $z_2$ according to:

$$L(v_i \to c_j) \leftarrow (z_1 - z_2);$$

wherein the normalization factors $z_1$ and $z_2$ are computed according to the following reverse water-filling constraints:

$$[x^+ + y^+ - z_1]_+ + [x^- + y^- - z_1]_+ = \gamma; \text{ and}$$

$$[x^- + y^+ - z_2]_+ + [x^+ + y^- - z_2]_+ = \gamma,$$

wherein $x^+, x^-, y^+$ and $y^-$ are differential representations of likelihoods as $x^+ = L^+(v_i \to c_j), x^- = L^-(v_i \to c_j), y^+ = L^+(c_j \to v_i)$, and $y^- = L^-(c_j \to v_i)$, and a normalization parameter $\gamma$ is dependent only on size and degree of nodes in a parity check matrix.

11. The system of claim 1, wherein the iterative code comprises a turbo code.

12. The system of claim 1, wherein the iterative code comprises a convolutional code.

13. The system of claim 1, wherein said normalization module approximates the log-map normalization factors using only additions, subtractions and threshold operations.

14. The system of claim 1, wherein for the scores including $f_i, i=1, \ldots, N$, said normalization module generates the approximation normalization factors z according to:

$$z = \log \sum_i^N e^{f_i}.$$

15. A margin decoding communications method, comprising:
   receiving a message encoded by an iterative code and processing the message into scores;
   performing a normalization process to iteratively approximate log-map normalization factors of the scores to generate approximation normalization factors; and
   decoding the received message based on the approximation normalization factors.

16. The method of claim 15, further comprising implementing the normalization process on analog structures using at least one universal conservation law.

17. The method of claim 16, wherein the at least one universal conservation law is at least one of charge, current, or mass.

18. The method of claim 17, wherein the at least one universal conservation law is charge.

19. The method of claim 18, wherein the analog structures include a CMOS electrical circuit, comprising:
   capacitors;
   transistors; and
   reset switches that regulate flow of charge,
   wherein, during a reset phase (R=1), charge stored on a node z is proportional to a differential parameter $\gamma^+ - \gamma^-$, and, when at least one of said reset switches is off (R=0), charge is distributed along the node z, subject to constraints imposed by said transistors, thereby ensuring that each of said capacitors stores charge proportional to a value $[f_i - z]+$, and at equilibrium, a voltage at node z settles down to satisfy a reverse water-filling criterion, according to:

$$\sum_i^N [f_i - z]_+ = \gamma.$$

20. The method of claim 17, wherein the at least one universal conservation law is current.

21. The method of claim 20, wherein the analog structures include a CMOS electrical circuit, comprising:
  sources of current herein represented as $f_i$, i=1, . . . ,N, and $\gamma$;
  a node through which a total of the current flowing into the node is equal to $\gamma$, thereby satisfying a reverse water-filling constraint according to:

$$\sum_i^N [f_i - z]_+ = \gamma;$$

a transistor connected between said sources of current and said node, wherein a portion of the current that flows through the transistor is equal to z; and
  a plurality of at least two additional transistors operably connected between said sources of current and said node, wherein a portion of the current through said additional transistors is equal to $[f_i-z]+$.

22. The method of claim 17, wherein the at least one universal conservation law is mass.

23. The method of claim 15, wherein the iterative code comprises a low-density parity check code.

24. The method of claim 23, wherein said normalization process approximates differential log-MAP normalization factors $z_1$ and $z_2$ according to:

$$L(v_i \to c_j) \leftarrow (z_1 - z_2);$$

wherein the normalization factors $z_1$ and $z_2$ are computed according to the following reverse water-filling constraints:

$$[x^+ + y^+ - z_1]_+ + [x^- + y^- - z_1]_+ = \gamma; \text{ and}$$

$$[x^- + y^+ - z_2]_+ + [x^+ + y^- z_2]_+ = \gamma,$$

Wherein $x^+, x^-, y^+$ and $y^-$ are differential representations of likelihoods as $x^+ = L^+(v_i \to c_j), x^- = L^-(v_i \to c_j), y+ = L^+(c_j \to v_i),$ and $y^- = L^-(c_j \to v_i)$, and a normalization parameter $\gamma$ is dependent only on size and degree of nodes in a parity check matrix.

25. The method of claim 15, wherein the iterative code comprises a turbo code.

26. The method of claim 15, wherein the iterative code comprises a convolutional code.

27. The method of claim 15, wherein the normalization process approximates the log-map normalization factors using only additions, subtractions and threshold operations.

28. The method of claim 15, wherein, for the scores including $f_i$ i=1, . . . ,N, the normalization process generates the approximation normalization factors z according to:

$$z = \log \sum_i^N e^{f_i}.$$

29. A margin decoding communications system, comprising:
  (a) a circuit receiving a message encoded by an iterative code and processing the message into scores;
  (b) a normalization module receiving the scores and iteratively approximating log-map normalization factors of the scores to generate approximation normalization factors; and
  (c) a receiver operably receiving the message and the approximation normalization factors, the receiver operably decoding the received message based on the approximation normalization factors;
  (d) the normalization module being implemented on analog structures using at least one universal conservation law, the analog structures including a CMOS electrical circuit comprising:
  a capacitor;
  a transistor;
  a reset switch; and
  (e) the normalization module approximating the log-map normalization factors using only additions, subtractions and threshold operations.

30. The system of claim 29, wherein the iterative code comprises a low-density parity check code.

* * * * *